United States Patent [19]

Blaess

[11] 4,264,859
[45] Apr. 28, 1981

[54] METHOD AND APPARATUS FOR MEASUREMENT OF ATTENUATION AND DISTORTION BY A TEST OBJECT

[75] Inventor: Gerhard Blaess, Olching, Fed. Rep. of Germany

[73] Assignee: Siemens Aktiengesellschaft, Berlin & Munich, Fed. Rep. of Germany

[21] Appl. No.: 87,887

[22] Filed: Oct. 24, 1979

[30] Foreign Application Priority Data

Nov. 13, 1978 [DE] Fed. Rep. of Germany ....... 2849174

[51] Int. Cl.³ .......................................... G01R 27/00
[52] U.S. Cl. ................................................ 324/57 SS
[58] Field of Search ............ 324/57 SS, 57 DE, 57 R, 324/58 A

[56] References Cited

U.S. PATENT DOCUMENTS

| 3,769,580 | 10/1973 | Black ................................ 324/57 R |
| 4,028,625 | 6/1977 | Berhrend .................... 324/57 DE X |
| 4,090,126 | 5/1978 | Poticha et al. ................... 324/57 SS |

OTHER PUBLICATIONS

French, Transfer Function Measurement Using Fast Pulses, Electronic Engineering, Aug. 1966, pp. 516–519.
Cochran, Measuring Waveform Distortion With a PAR Meter, Bell Laboratories Record, Oct. 1965, pp. 369–371.
Characteristics of an Impulse–Noise Measuring Instrument for Wideband Data Transmissions, CCI Recommendation, Recommendation 0.81, vol. IV. 2, pp. 44–50.
Ebersberger, Impedance-Matching Measurements with Sweep-Generator Assembly Polyskop III SWOB, News from Rhode & Schwarz, vol. 12, No. 53, 1972, pp. 19–23.

Primary Examiner—Stanley T. Krawczewicz
Attorney, Agent, or Firm—Hill, Van Santen, Steadman, Chiara & Simpson

[57] ABSTRACT

A method for measuring the transmission characteristics of an object under test consists of applying a test pulse to the input of an object under test which has a filter characteristic, and evaluating the test pulse when it is produced at the output. The test pulse is made up of a plurality of component frequencies at equally spaced intervals, and the components which lie within the region of the edge of the pass band of the filter characteristic have greater amplitudes than the components which lie within the central portion of the pass band of the filter characteristic. Evaluation of the test pulse at the output of the object under test yields the attenuation and phase characteristics of the object under test for each component frequency.

13 Claims, 4 Drawing Figures

METHOD AND APPARATUS FOR MEASUREMENT OF ATTENUATION AND DISTORTION BY A TEST OBJECT

FIELD OF THE INVENTION

This invention relates to a method and apparatus for the measurement of attenuation and delay time distortion in a test object to which a test pulse is supplied.

THE PRIOR ART

A method for measuring the transfer function of an object under test is known from the article in "Electronic Engineering", August, 1966, pages 516–519. As described therein, a function having infinitely narrow pulses supplies a constant amplitude distribution of harmonics at all frequencies to a device under test. A sequence of such narrow pulses is delivered to the object under test, and the waveform of the signal which is produced at the output of the object under test, is recorded after sampling and subjection to Fourier analysis. The test pulse (or exciting pulse) is also sampled and subjected to Fourier analysis in the same way. In practice, an infinitely short pulse cannot be employed, but a pulse which is as short as possible is used, which produces a spectral function of sin x/x.

The prior art method has the disadvantage that both the test pulse and the distorted pulse must be recorded and subjected to Fourier analysis. When the object under test is a transmission line, the problem arises that the test pulse is not directly available at the output end of the transmission line. Thus, either an additional transmission must be undertaken of the exciting pulse, or data relating thereto, or else the data at the output end of the transmission line must be retransmitted to the input end. This requires a relatively large amount of equipment, and there is also the disadvantage that any kind of transmission failure directly influences the result of the measurement. Further, errors may enter into the measurement during the Fourier analysis, both at the input end and the output end of the transmission line.

The infinitely numerous harmonics of the exciting function sin x/x occurring with such pulses occupy very wide frequency bands and lead to disruptions of communications in adjacent channels when the measurement is undertaken in specific channels. It is also disadvantageous for practical operation that the amplitudes of the individual harmonics are predetermined by the form of the exciting pulse employed and therefore cannot be freely selected. This is particularly disadvantageous when the object under test has a filter characteristic, because of limitations on the precision of the measurement of the transmission characteristics.

The loading of the system being tested by narrow pulses may be determined by calculation of the Crest Factor $c_f$. The Crest Factor is defined by the ratio of the peak voltage value to the effective voltage value. When very narrow rectangular pulses are used for excitation, the Crest Factor is very high and cannot be changed.

BRIEF SUMMARY OF THE INVENTION

A principal object of the present invention is to provide a method and apparatus for improving the precision in measuring the transmission characteristics of an object under test which has a filter characteristic.

In accordance with one embodiment of the invention, a test pulse is employed which is made of a plurality of components having different frequencies, and the amplitudes of the components near the cut-off frequencies of the filter are selected larger than the amplitudes of components within the pass band of the object under test.

In the present invention, the test pulse consists of a series of oscillations of different frequencies which have predetermined amplitudes in initial phases and are formed according to the equation $$V(t) = \sum_{1}^{n} A_n \cdot \cos(2 \cdot \pi \cdot f \cdot t - \phi_n)$$

wherein $A_n$ is the amplitude of a component n and $\phi_n$ is the initial phase of a component having a frequency $n \times f$.

An advantageous result of the present invention is that the adjustment of the amplitudes of the components at the input side of the object under test can take place very simply and has no disadvantageous consequences affecting the quality of the measurement. Particularly large amplitude values are available in the region of the cut-off frequencies, and the relatively great attenuation there can readily be determined, and the signal-to-noise ratio minimized. In the band pass region, the lower amplitude values suffice for precise measurement, because of the lower attenuation.

It is also an advantage of the present invention that the Crest Factor $c_f$ can be reduced. The Crest Factor is the ratio of peak value to effective value, and is equal to:

$$c_f = \frac{A_1 + A_2 + \ldots + A_n}{A_1^2/2 + A_2^2/2 + \ldots A_n^2/2}$$

where $A_n$ is the amplitude of the nth component, and all components comprise cosine functions with an initial phase angle of 0°.

The apparatus in one embodiment of the present invention incorporates a storage device which is provided at the input side of the object in a test which contains a multiplicity of time sample values from a test pulse formed with the individual components with their different amplitude values. These sampling values are read out rapidly in succession to form the test or exciting pulse. A storage device is also provided on the output side of the object under test in which the parameters of the test pulse, including the original amplitude values, are likewise stored and are available for evaluation of the distorted pulse received at the output of the object under test.

BRIEF DESCRIPTION OF THE DRAWINGS

Reference will now be made to the accompanying drawings in which.

DESCRIPTION OF THE PREFERRED EMBODIMENT

Figure 1:
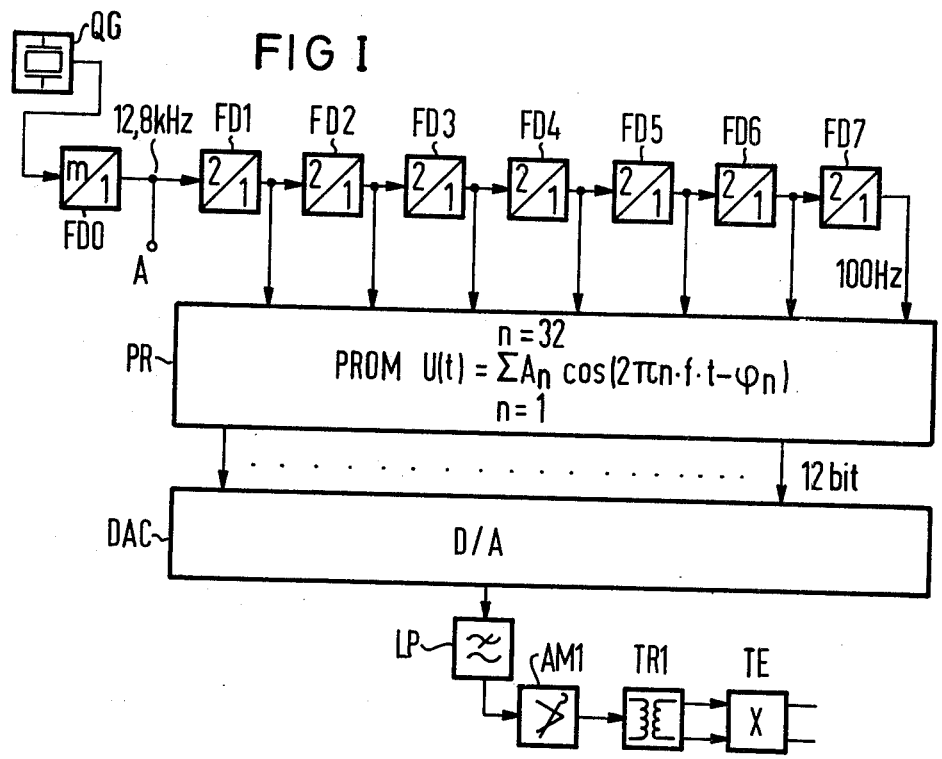
FIG. 1 is a functional block diagram of apparatus for generating a test pulse.

Referring now to FIG. 1, apparatus is illustrated for generating a test pulse to be applied to an object under test TE. As an example, the object under test TE may be a data or telephone channel having a bandwidth of 300 Hz through 3 kHz. A crystal oscillator QG generates a signal which is connected to the input of a frequency divider FD0, which produces at its output a square wave of 12.8 kHz. This signal is applied to a series of six frequency dividers FD1 through FD6, connected in cascade, to form a binary counter. The output of each of the flip-flops FD1–FD6 are connected as address inputs to a programmable read-only memory unit (PROM)PR. A total of sixty-four different combinations of output signals are produced by the frequency dividers FD1–FD6, which successively address sixty-four storage locations within the PROM unit PR. Each memory location of the PROM unit PR contains a 12-bit word which, when accessed, is read out to the input terminals of a digital-to-analog converter DAC, which produces at its output an analog signal having an amplitude at each instant corresponding to the 12-bit digital word being accessed at that instant. Each of the 12-bit words contains the digitized instantaneous amplitude value of an undistorted time function:

$$V(t) = \sum_{n=1}^{n=16} A_n \cdot \cos(2\pi \cdot n \cdot f \cdot t - \phi_n)$$

By reading out the data stored in successive storage locations of the PROM unit PR, a test pulse is generated as a step curve, the amplitude of which proceeds directly from step-to-step without any gap or return to a reference value between successive steps. My copending application Ser. No. 910,769, filed May 30, 1978 discloses an arrangement for generating a test pulse.

The test pulse has a period given by $1/f_1$ whereby $f_1$ represents the frequency of the lowest harmonic, which in the example which follows is 200 Hz.

A test pulse may be formed, for example, of sixteen individual harmonics, each having a frequency separation of 200 Hz, occupying a frequency band of between 200 Hz through 3200 Hz. A sampling frequency must be employed which is high enough so that the highest frequency (3200 Hz) is sampled more than twice. According to the sampling frequency, it must exceed 6400 Hz. In the present example, the selected sampling frequency is 12.8 kHz, so the sampling requirement for the highest frequency is met with certainty.

Since the lowest harmonic frequency is 200 Hz, the period of the test pulse is 5 ms. During each 5 ms period, the sixty-four successive sampling values are read out of the PROM unit PR, one for each cycle of the 12.8 kHz frequency, so that the interval between successive steps of the test pulse is 78.125 microseconds.

The waveform of the test pulse, with its sixteen components, is determined either by computation or graphically, with individual amplitudes $A_1$ through $A_{16}$, and with initial phase angles of $\phi_1$ through $\phi_{16}$. The amplitude of the composite test pulse is digitized and entered into the storage locations of the PROM unit PR, each digitized value corresponding to the average amplitude during an interval of 78.125 microseconds. Accordingly, when the sixty-four storage locations of the PROM unit are accessed successively, the output of the digital-to-analog converter DAC corresponds closely to the graph or computed test pulse. A low-pass filter LP is connected to the output of the digital-to-analog converter DAC to smooth the test pulse. During operation, all of the storage locations of the PROM unit PR are accessed repetitively, so that after each 5 ms period of the test pulse, a new test pulse begins at once. A sufficient number of test pulses are transmitted in succession in this manner until transients are dissipated, and the response at the output end of the object under test is constant from period to period. At least one period T has been sampled at the output end of the object under test, at the same rate as the sampling takes place at the input end, to yield sixty-four sampling values, which are stored and subjected to the Fourier analysis in either analog or digital form. The result of such analysis is to produce parameters corresponding to the individual amplitude values $A_{1*}$ through $A_{16*}$ (at the output end of the object under test) as well as the corresponding phase angles $\phi_{1*}$ through $\phi_{16*}$.

If there is any distortion such as attenuation or phase shift which occurs in the low-pass filter LP, this can be compensated by means of a preliminary correction of the sampling values so as to counteract or compensate for the distortion.

The output of the low-pass filter LP is passed through an amplifier $AM_1$, which has an adjustable gain, to an adapter circuit TR1 which may be for example a line transmitter. The output of the adapter circuit TR1 is connected to the input of the object of the test TE.

Figure 2:
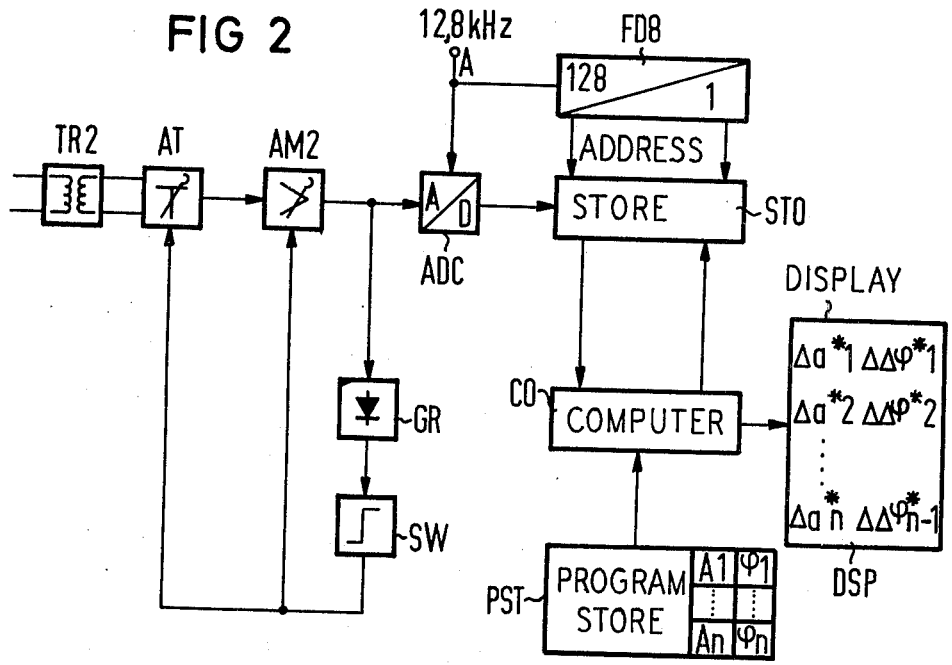
FIG. 2 is a functional block diagram of apparatus located at the output side of the object under test for evaluating the distorted test pulse.

FIG. 2 illustrates apparatus located at the output side of the device under test TE, for evaluating the transmission characteristics of the object under test TE. The distorted test pulse first arrives at an adapter circuit TR2, the output of which is connected to the input of an attenuator AT. The output of the attenuator is passed through an amplifier AM2 and arrives at the input of an analog-to-digital converter unit ADC. The output of the amplifier AM2 is also connected through a rectifier GR to the input of a threshold circuit SW which produces a signal which adjusts the gain of the attenuator AT and the amplifier AM2. In this way, the gain of the attenuator and amplifier are adjusted so that the maximum amplitude of the distorted test pulse is equal to a fixed value. The speed of response of the circuit including the rectifier GR and the threshold circuit SW is sufficiently slow, so that the characteristics of the attenuator AT and the amplifier AM2 remain substantially constant throughout the period of the received pulse, after an initial transient period.

The analog-to-digital converter ADC is provided with a sample-and-hold circuit, which circuit is sampled by clock pulses at a frequency of 12.8 kHz, supplied to a terminal A. These signals correspond precisely to the clock signals employed in the apparatus of FIG. 1, and may be derived by connection to terminal A at the output of the divider FDO in FIG. 1.

The clock frequency is also supplied to a frequency divider FD7 which functions as a 6-bit binary counter, the outputs of which are connected to the address inputs of a storage device STO. The divider FD7 may be constructed identically to the chain of frequency dividers FD1–FD6 illustrated in FIG. 1. The storage device STO functions to store the digital outputs of the analog-to-digital converter ADC at each of sixty-four memory locations which are accessed by FD7. After sixty-four time periods have been sampled and stored, the storage device contains the digitized amplitudes corresponding to one 5 ms period of the test pulse, and the sampling and storage operation is then terminated (by means not shown).

Subsequently, the storage device STO cooperates with a computer CO by which the sixty-four sample values are subjected to a fast Fourier transform, in the manner described in the book by G. Oran Brigham, "The Fast Fourier Transform", at pages 163-171. The program for this transform is contained in the program storage device PST, which is connected with a computer CO, and which also incorporates a storage unit storing representations of the individual amplitude values $A_1, A_2, \ldots A_n$, and the initial phase angles $\phi_1, \phi_2, \ldots \phi_n$, for the original (undistorted) test pulse.

The fast Fourier transform program converts data from the time domain into the frequency domain, to yield the real ($R_n*$) and imaginary ($I_n*$) parts for each of the sixteen harmonics making up the test pulse. From these parts, the amplitude $A_n*$ for each harmonic may be calculated according to the equation:

$$A_n* = \sqrt{(R_n*)^2 + (I_n*)^2}$$

The phase $\phi_n*$ may also be calculated, according to the equation:

$$\phi_n* = \text{arctg}\, \frac{I_n*}{R_n*}$$

Programs for making these calculations are also contained in the program store unit PST.

Where the object under test TE has a frequency dependent attenuation, such as due to a filter characteristic or the like, then the individual amplitudes $A_1* \ldots A_n*$ are not identical to the individual amplitudes $A_1 \ldots A_n$ of which the undistorted test pulse was composed. The change in amplitude $a_n*$ due to the object under test, which indicates the attenuation distortion at the various frequency values $F_1$ through $F_n$, is calculated for each harmonic by the equation:

$$a_n* = A_n*/A_n.$$

The values $a_n*$ for the several harmonics is presented visually on a suitable display device DSP controlled by the computer CO. The display program is contained in the program store unit PST, which also stores the amplitude distribution of the original test pulse.

Where the object under test also has a frequency dependent phase shift, then the difference in the phase angle of two adjacent harmonics is a measure of the group transmit time, according to the equation:

$$\tau_g = \frac{d\phi*}{d\omega} \approx \frac{\Delta(\Delta\phi_n*)}{\Delta\omega}$$

This equation gives a precise result when there are a great number of harmonics within the pass band being investigated. In that event, the simplification $\Delta\omega = 2\pi \times f_1 = $ constant is valid.

In order to determine the difference in the phase change of neighboring harmonics, the change in phase of each harmonic is first determined according to the equation:

$$\Delta\phi n* = \phi n* - \phi n$$

The values of $\phi_n$, which are the phases of the harmonics of the original test pulse, are stored in the program store unit PST. The difference in the phase change of two neighboring harmonics is thus $$\Delta(\Delta\phi_n*) = (\phi_n* + 1 - \phi_n + 1) - (\phi_n* - \phi_n)$$
$$= (\phi_n* + 1 - \phi_n*) - (\phi_n + 1 - \phi_n)$$

Thus, the group transmit time $\tau_g$ can be calculated from data located in the storage device STO and the program store PST, and presented on the display device DSP.

Although the group transit time $\tau_g$ can be measured absolutely when a complete loop of a transmission line is being tested, the absolute value of $\tau_g$ cannot be determined when only a segment is being measured, because of lack of the reference time. By the procedure outlined above, however, the group transit time distortion is indicated at any selected frequency.

Although the apparatus of FIGS. 1 and 2 have been described as digital devices, it is possible to employ analog memories and evaluation devices in place of the digital ones.

Although the time domain values for the successive portions of the test pulse are stored at the input side in the PROM unit PR, preferably the values for the frequency domain are stored in the program control unit PST at the output side, because the Fourier analysis is carried out at the output end of the object under test, and the comparison of the Fourier parameters can be made there simply.

Figure 3:
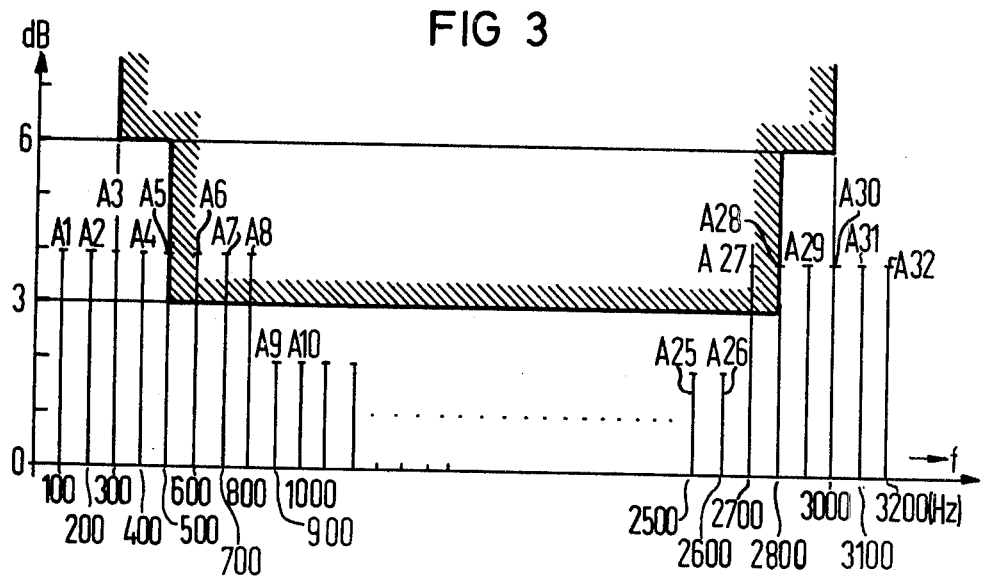
FIG. 3 shows the attenuation characteristic of a typical transmission line, and also shows distribution of components of a test pulse in accordance with one embodiment of the present invention.

FIG. 3 illustrates a design attenuation characteristic of a typical telephone transmission line, in accordance with a CCI recommendation. The shaded line indicates this attenuation characteristic, which shows a pass band between frequencies of 500 Hz and 2800 Hz, with an attenuation of at least 3 db from 500 Hz down to 300 Hz, and from 2800 Hz up to 3000 Hz. The attenuation at the upper and lower limits should be no more than 6 db, but no limitation of the attenuation as specified below 300 Hz or above 3000 Hz.

FIG. 3 also illustrates the relative amplitudes of components of a test pulse. The amplitudes are identified as $A_1 \ldots A_{32}$, which comprise 32 harmonics of a separation frequency of 100 Hz, and cover the band from 100 through 3200 Hz in uniform steps. It is of particular importance that the measurements at the limits of the band pass region be precisely determined, in order to measure precisely the attenuation characteristics relative to frequency near the cut-off regions.

In order to improve the measuring precision in the region of the pass band limits, the amplitude values $A_1$ through $A_7$ (100 Hz through 700 Hz) as well as $A_{27}$ through $A_{32}$ (2700 Hz through 3200 Hz) are provided with increased amplitude values. The intermediate components, lying within the pass band range, have significantly lower amplitude values. Because of the greater amplitude values $A_1$-$A_7$ and $A_{27}$-$A_{32}$, there is a greatly increased precision of measurement of the attenuation characteristics in these regions, because the magnitudes of the components received at the output end of the object under test are higher and are therefore more clearly distinguishable from noise or other disruptive influences, despite the higher attenuation in these frequency ranges. The amplitude values lying near the center of the pass band, however, i.e., amplitude values $A_9$-$A_{26}$, arrive at the output of the object under test with a relatively high level, because the attenuation at those frequencies is relatively low. Accordingly, the measurement can be carried out with precision, despite the lower amplitudes of the components of these frequencies within the test pulse.

Preferably, the levels of all of the components as they arrive at the output of the object under test are equal insofar as possible. To accomplish this, the initial amplitudes of the individual components are selected in accordance with the attenuation characteristic. It is also within the present invention, however, to select a linear rise in amplitude, relative to frequency, in the area of the limits of the pass band. Alternatively, the amplitude values may increase in stages proceeding from the pass band through the region in the vicinity of the limits of the pass band.

When the measuring results are converted to a specific reference frequency, such as 800 Hz, near the center of the band pass, it is particularly advantageous to measure this reference frequency as precisely as possible. Therefore, the amplitude value of the reference frequency such as $A_8$ is also advantageously increased within the test pulse. Accordingly, the amplitude value $A_8$ in the illustration of FIG. 3 is selected to be equal to the amplitude values $A_1$-$A_7$, and $A_{27}$-$A_{32}$.

In the measurement of the group transit time distortion, a reference frequency is selected, and it is also advantageous to select an increased amplitude for this frequency, in order to achieve the maximum precision of measurement.

Figure 4:
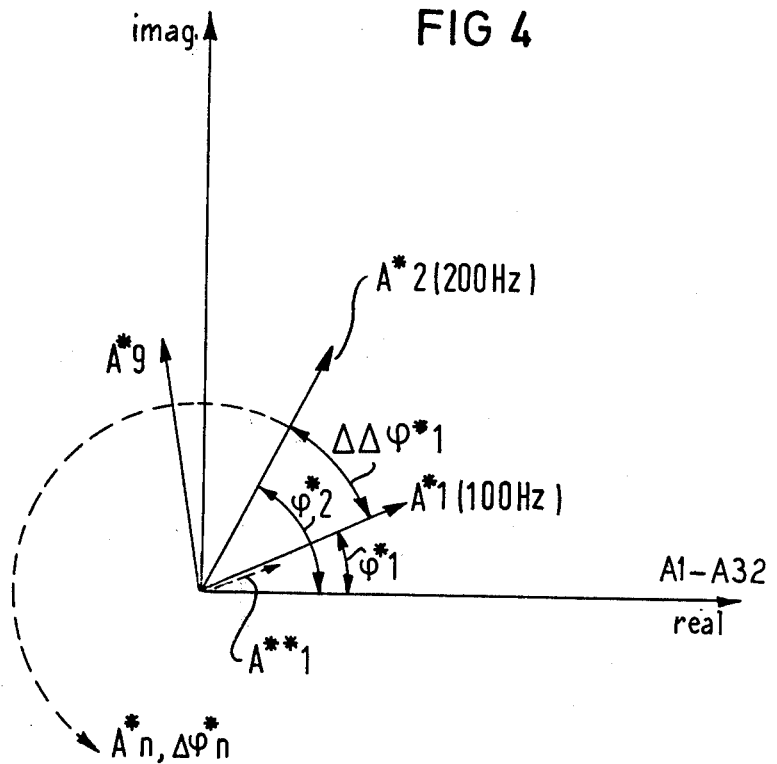
FIG. 4 is a vector diagram of individual components of the test pulse after Fourier analysis at the output end of the object under test.

FIG. 4 illustrates a vector diameter showing the relationships of the amplitudes and phases of several components of the test pulse. For this diagram, it is assumed that the initial phase angles of all the components are equal to 0. The amplitude and phase angle of several of the components, as they are presented at the output of the object under test, are illustrated. The vector $A_{1*}$ represents the component at the 100 Hz frequency, the vector $A_{2*}$ represents the component at 200 Hz, and the vector $A_{9*}$ represents the components at 900 Hz. A phase displacement of $\phi_{1*}$ exists between the vector $A_{1*}$ and the vector $A_{2*}$, such phase displacement being displayed by the display device DSP (FIG. 2) and reproducing the phase distortion as a measure for the group transit time in the range between 100 Hz and 200 Hz. In the same manner, $\phi_{2*}$ indicates a group transit time between 200 Hz and 300 Hz, etc. A complete vector diagram in the style of FIG. 4 would therefore reproduce the total result at the output of the object under test. Since all of the components had an initial phase angle equal to 0, the change in phase angle can be referred to a single reference line, as illustrated in FIG. 4.

For the evaluation of the attenuation at any frequency, it must be taken into consideration that the length of the vector $A_{1*}$ must be related to the initial amplitude of the first component $A_{1*}$, and so on. As illustrated in FIG. 4, the level of $A_{9*}$ is approximately equal to the magnitude of $A_{1*}$, $A_{2*}$, etc. This result is achieved when the amplitude distribution $A_1$-$A_{32}$ for the test pulse is chosen in accordance with the attenuation characteristic of the object under test. This results in an improvement of the Crest Factor and also results in increased measuring precision. If, on the contrary, the amplitude $A_1$ were only approximately equal to that of $A_9$-$A_{26}$, the level of this component at the output of the object under test would be much smaller, and is illustrated as $A_{1}$ in FIG. 4. The lower level of $A_{1}$ results in much less precision in its measurement.

For the amplitude distribution of components as illustrated in FIG. 3, in which the amplitude values $A_9$-$A_{26}$ are only half the amplitude of the other components, then the sum of the amplitudes of the components is equal to 23, and the effective value, equal to the square root of the sum of the squares of the amplitudes of the several components, is equal to 3.04, giving a Crest Factor of 7.56. This Crest Factor is much more favorable than would be obtained if the amplitudes of all components are equal, in which case the Crest Factor would be equal to 8. In each case, the components are represented as a cosine function with an initial phase angle equal to 0°.

Whereas the time domain function of the test pulse is expediently stored in the PROM unit PR at the input side of the object under test, the parameters stored in the storage device PST at the output side of the object under test are advantageously parameters in the frequency domain. Since the Fourier analysis, which is carried out at the output side of the object under test, produces results in the frequency domain, the comparison of such results with the stored results for the original test pulse is particularly easy to carry out.

From the foregoing, it will be clear to those skilled in the art how the apparatus and method of the present invention can be used to make precise measurements of the transmission characteristics of objects under test with a relatively low Crest Factor. In FIGS. 1 and 2, the details of the apparatus employed has not been disclosed, because the individual components of such apparatus are available in the art, and their construction and use is familiar to those working in the art. The specific computer which may be employed, as a matter within the choice of one skilled in the art, and the particular program steps which are employed in carrying out the method of the present invention are adapted to the computer which is chosen, as well understood in the art. Moreover, the method of the present invention may be practiced without the use of a computer, since the calculations involving the Fourier transform, and the comparison of the parameters corresponding to the initial and distorted test pulse may be carried out by hand, if desired. Other modifications and additions may be made in the apparatus and method of the present invention without departing from the features of novelty thereof, which are intended to be defined and secured by the appended claims.

What is claimed is:

1. A method of measuring the transmission characteristics of an object under test having a filter characteristic by applying a test pulse to the input of the object and by evaluating, by Fourier analysis, the deformation of the test pulse as it is produced at the output of the object under test, said test pulse being formed of a plurality of components having different frequencies and predetermined amplitudes in initial phase angles, and formed according to the equation:

$$V(t) = \sum_{1}^{n} An \cos(2 \cdot \pi \cdot f \cdot t - \phi_n)$$

where $A_n$ is the amplitude of the nth component and $\phi_n$ is the initial phase angle of component n, such component having a frequency equal to $n \times f$, said components being summed to form a test pulse, the amplitude values of said components being chosen such that those for components lying in the region of the cut-off frequency of the filter characteristic are greater than the amplitude values for components which lie within the band pass region of the filter characteristic.

2. The method according to claim 1, including the step of selecting a greater amplitude level for a reference frequency within the pass band of said filter characteristic than for the other components having frequencies lying within the pass band of said filter characteristic.

3. The method according to claim 1, including the step of selecting the amplitudes of said components in accordance with said filter characteristic, such that the amplitudes of all components as they are produced at the output of said object under test are approximately equal.

4. The method according to claim 1, wherein only two different amplitude values are employed for all of said components.

5. The method according to claim 1, including the step of applying said test pulse to the input of said object under test for an interval at least equal to the period of the lowest frequency component of said test pulse.

6. The method according to claim 1, including the step of applying successive test pulses to the input of said object under test, each test pulse after the first such test pulse beginning coincidentally with the end of the preceding test pulse.

7. The method according to claim 1, including the step of storing in a storage device sampling values corresponding to a succession of time intervals of a test pulse in a storage device, forming said test pulse by successively reading out from said storage device values for successive intervals, and performing said reading-out function at a rate which is more than twice the size of the highest frequency component of the test pulse.

8. The method according to claim 7, including the step of employing a plurality of frequency dividers connected to receive a signal having a frequency corresponding to said reading-out function, using the outputs of said frequency dividers for accessing said storage device, the lowest frequency obtained from said frequency dividers coinciding with the frequency of the component having the lowest frequency within said test pulse.

9. The method according to claim 7, including the step of sampling the test pulse as it is produced at the output of said object under test at the same rate as said reading-out function.

10. Apparatus for measuring the transmission characteristic of an object under test comprising in combination first storage means located near the input of said object under test, said first storage means storing a plurality of sampling values corresponding to the magnitude, at consecutive time intervals, of a test pulse formed of a plurality of individual components at a plurality of frequencies, means for reading out said sampling values from said first storage means in succession, said storage means located near the output of said object under test, said second storage means storing values corresponding to the initial amplitudes of all of the components of said test pulse, means for sampling sequential intervals of the test pulse as it arrives at the output of said device under test, means for deriving values corresponding to the modified amplitudes of said components as they are presented at the output of said device under test, and means for comparing said derived values with the values stored in said second storage means.

11. Apparatus according to claim 10, wherein said first storage means comprises a digital storage device and including a digital-to-analog converter and a low pass filter connected between said first storage means and said object under test.

12. Apparatus according to claim 10, including a control circuit interconnected between the output of said device under test and the input of said sampling means for holding the maximum amplitude of said test pulse to a uniform level as it is sampled.

13. Apparatus according to claim 10, wherein said first storage means stores time domain data relating to said test pulse and said second storage means stores frequency domain data relating to said test pulse.

* * * * *